United States Patent
Yang et al.

(10) Patent No.: US 7,402,883 B2
(45) Date of Patent: Jul. 22, 2008

(54) BACK END OF THE LINE STRUCTURES WITH LINER AND NOBLE METAL LAYER

(75) Inventors: Chih-Chao Yang, Poughkeepsie, NY (US); Shyng-Tsong Chen, Patterson, NY (US); Shom Ponoth, Fishkill, NY (US); Terry A. Spooner, New Fairfield, CT (US)

(73) Assignee: International Business Machines Corporation, Inc., Armonk, NY (US)

( * ) Notice: Subject to any disclaimer, the term of this patent is extended or adjusted under 35 U.S.C. 154(b) by 0 days.

(21) Appl. No.: 11/380,074

(22) Filed: Apr. 25, 2006

(65) Prior Publication Data

US 2007/0246792 A1 Oct. 25, 2007

(51) Int. Cl.
*H01L 23/48* (2006.01)
(52) U.S. Cl. .................. 257/499; 257/E23.167; 257/E23.144; 257/E23.145; 257/E23.161; 257/751; 257/750; 257/774; 257/758; 257/763; 257/762; 257/761
(58) Field of Classification Search ............ 257/499, 257/E23.167, E23.144, E23.145, E21.584, 257/E23.161, E21.57, 774, 758, 751, 752, 257/761, 762, 763
See application file for complete search history.

(56) References Cited

U.S. PATENT DOCUMENTS

| | | | |
|---|---|---|---|
| 6,345,665 B1 * | 2/2002 | Schulz-Harder | 165/80.4 |
| 6,441,492 B1 | 8/2002 | Cunningham | |
| 7,187,085 B2 * | 3/2007 | Clevenger et al. | 257/774 |
| 2002/0153554 A1 * | 10/2002 | Kajita et al. | 257/306 |
| 2005/0064701 A1 * | 3/2005 | Dalton et al. | 438/627 |
| 2006/0019485 A1 * | 1/2006 | Komai et al. | 438/627 |
| 2006/0073695 A1 * | 4/2006 | Filippi et al. | 438/619 |
| 2007/0032062 A1 * | 2/2007 | Lee et al. | 438/597 |
| 2007/0049007 A1 * | 3/2007 | Yang et al. | 438/625 |
| 2007/0096319 A1 * | 5/2007 | Hsu et al. | 257/750 |
| 2007/0117377 A1 * | 5/2007 | Yang et al. | 438/638 |
| 2007/0158717 A1 * | 7/2007 | Edelstein et al. | 257/296 |
| 2007/0161239 A1 * | 7/2007 | Murray et al. | 438/678 |
| 2007/0194450 A1 * | 8/2007 | Tyberg et al. | 257/751 |
| 2007/0196639 A1 * | 8/2007 | Gates et al. | 428/315.7 |
| 2007/0205482 A1 * | 9/2007 | Yang et al. | 257/499 |

* cited by examiner

*Primary Examiner*—Alexander O Williams
(74) *Attorney, Agent, or Firm*—Joseph Petrokaitis; Hoffman Warnick LLC

(57) ABSTRACT

A back end of the line (BEOL) structure of a semiconductor device is presented. In one embodiment, the structure may include a first liner layer disposed on an intermediate interconnect structure, the intermediate interconnect structure having an opening disposed between two surfaces of a dielectric material, wherein the first liner layer is in direct contact with at least a portion of a conductive wiring material of an underneath interconnect layer; a noble metal layer disposed on the first liner layer at least in the opening; and a conductive wiring material disposed on the noble metal layer, the conductive wiring material substantially filling the opening; wherein the first liner layer, the noble metal layer and the conductive wiring material are coplanar with the two surfaces of the dielectric material of the intermediate interconnect structure, and the noble metal layer includes a different material than the first liner layer.

13 Claims, 5 Drawing Sheets

(Pror Art)

BACK END OF THE LINE STRUCTURES WITH LINER AND NOBLE METAL LAYER

BACKGROUND OF THE INVENTION

1. Technical Field

The invention relates generally to semiconductor fabrication, and more particularly, to methods for fabricating a back end of the line (BEOL) interconnect structure with liner and seed materials for integration of conductive materials on the substrate layer of the semiconductor.

2. Background Art

The current trend of diminishing critical dimensions of semiconductor devices presents fill issues with the conventional fabrication methods of interconnect layers using a seed layer of conductive wiring material. Noble metals as liner layers have been adopted in light of thermodynamic stability, good adhesion, and immiscibility with conductive wiring materials where fill issues are eliminated. The fairly low electrical resistivity of noble metals, like ruthenium (Ru), enables direct electroplating of conductive wiring materials, like copper (Cu), making this an essential and advantageous feature due to better electrical performance and a wider process window for later Cu plating.

With these advantages, noble metals are good alternative liner materials in place of conductive wiring materials as seed layers. As illustrated in FIG. 1, however, it is a challenge to remove a noble metal liner layer 14 using conventional chemical-mechanical polishing (CMP) such that the noble metal layer 14, first liner layer 12, hard mask 10 and conductive wiring material 20 are coplanar. The polishing removal rate of noble metals, like ruthenium (Ru) is comparatively lower than that of conventional liner materials like tantalum nitride (TaN), tantalum (Ta), titanium (Ti), titanium (TiN). Hardware and the chemistries for existing CMP process need to be modified due to this difference. Such modification is costly and disruptive to the semiconductor fabrication process. Introduction of a new material may also require development or use of new slurries in the CMP process as compared to existing slurries used in the removal of barrier materials like tantalum nitride (TaN) and titanium nitride (TiN).

In view of the foregoing, there is a need in the art for a solution to the problems of the related art.

SUMMARY OF THE INVENTION

The present invention includes a method that employs sputter-etching in the fabrication of a back end of the line (BEOL) interconnect structure of a semiconductor where a noble metal liner layer deposited on the surface or field of the intermediate interconnect structure is thinned down. The noble metal liner layer is substantially thinned down to a point where the effect of the noble metal has no significant effect in the chemical-mechanical polishing (CMP) process. The noble metal liner layer may be completely removed by sputter etching to facilitate effective planarization to take place.

A first aspect of the invention provides a method of fabricating a back end of the line (BEOL) interconnect structure of a semiconductor, the method comprising: depositing a noble metal layer onto an intermediate interconnect structure, wherein the intermediate interconnect structure includes an opening disposed between two surfaces of dielectric material; sputter-etching the noble metal layer on the two surfaces to at least substantially thin down the noble metal layer; depositing a conductive wiring material to fill the opening by electroplating; and polishing the intermediate interconnect structure such that the noble metal layer and the conductive wiring material are coplanar with the two surfaces of dielectric material of the intermediate interconnect structure. The method may further include depositing a seed layer of conductive wiring material onto the sputter-etched noble metal layer of the interconnect structure.

A second aspect of the invention provides a back end of the line (BEOL) structure of a semiconductor, the structure comprising: a first liner layer disposed on an intermediate interconnect structure, the intermediate interconnect structure having an opening disposed between two surfaces of a dielectric material, wherein the first liner layer is in direct contact with at least a portion of a conductive wiring material of an underneath interconnect layer; a noble metal layer disposed on the first liner layer at least in the opening; and a conductive wiring material disposed on the noble metal layer, the conductive wiring material substantially filling the opening; wherein the first liner layer, the noble metal layer and the conductive wiring material are coplanar with the two surfaces of the dielectric material of the intermediate interconnect structure.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

FIGS. 2-9 illustrate a method and an intermediate product where a noble metal, e.g., ruthenium (Ru), is used as a liner layer according to embodiments of the present invention. The methods will be described relative to a back end of the line (BEOL) intermediate interconnect structure. Back end of the line (BEOL) refers to fabrication operation performed on a semiconductor wafer in the course of device manufacturing following a first metallization in which transistors, contacts, etc., are formed. It should be recognized, however, that the methods may be applied to a variety of BEOL intermediate interconnect structures.

Figure 1:
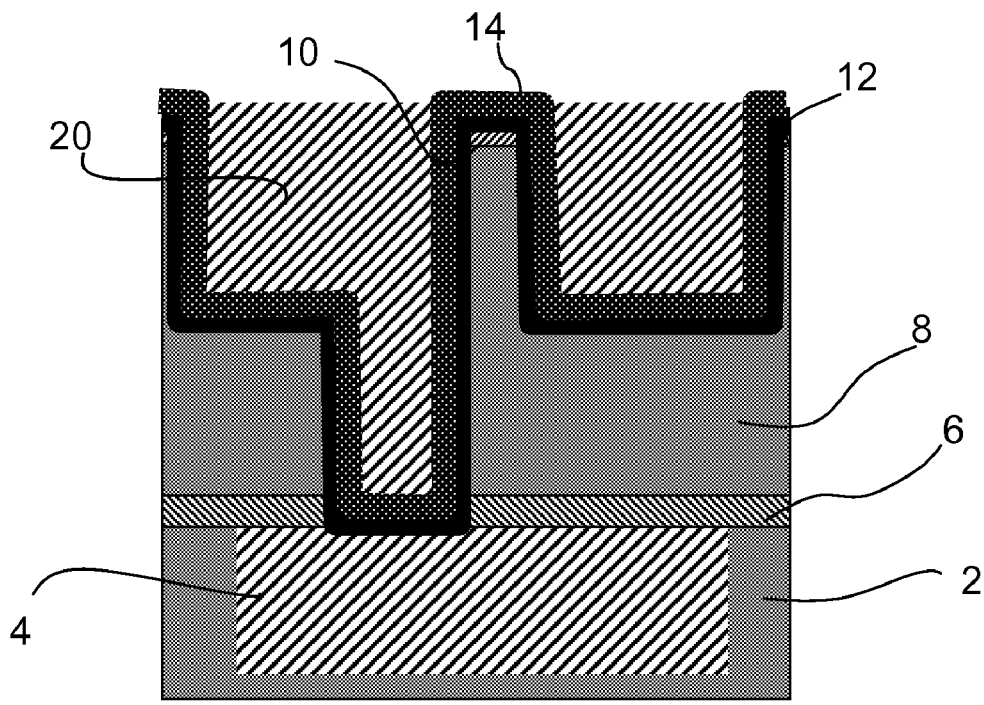
FIG. 1 is a sectional view of a semiconductor fabricated using a conventional chemical-mechanical polishing process.
Figure 2:
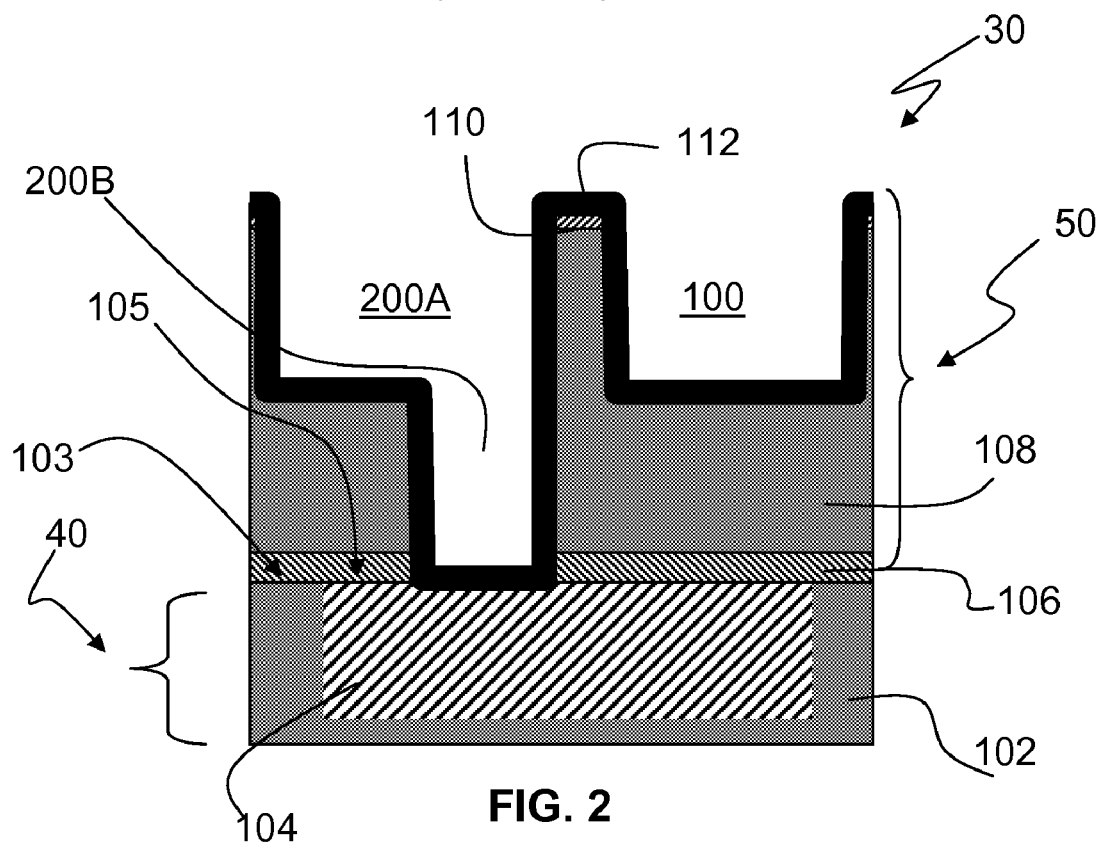
FIG. 2 is a sectional view of a semiconductor with a first liner layer deposited in a back end of the line (BEOL) intermediate interconnect in an embodiment of the present invention.

A process flow according to one embodiment begins with providing an initial interconnect structure 30 shown in FIG. 2. Specifically, the initial interconnect structure 30 includes a multilevel interconnect including a lower interconnect level 40 and an upper interconnect level 50 that are separated in part by a dielectric capping layer 106. Lower interconnect level 40, which may be located above a semiconductor substrate (not shown) including one or more semiconductor devices, includes a first dielectric material 102 having at least one conductive feature 104, which is basically a conductive region. Conductive feature 104 may be separated from first dielectric layer 102 by a barrier layer (not shown). Upper interconnect level 50 includes a second dielectric material 108 that has at least an opening/a trench, for example, a line opening 100 or a via opening 200B. Opening 100 denotes a line opening for single damascene structure, and openings 200A and 200B denote a line opening and a via opening, respectively, for a dual damascene structure. Line opening 200A extends into a via opening 200B which exposes a portion of conductive feature 104. Atop upper interconnect level 50 is a patterned hard mask 110. Additional embodiments of the invention may consider single line openings and/or various combinations of line and via openings. FIG. 2 illustrates a single line opening 100 and a line opening 200A with a via opening 200B, however, the present invention contemplates forming any number of line openings 100 and/or combinations of line 200A and via 200B openings in second dielectric material 108, where via openings exposes other conductive features 104 that may be present in first dielectric material 102 to enable electrical contact between lower 40 and upper 50 interconnect levels.

A first liner layer 112, which may include, for example, tantalum (Ta), titanium (Ti), tantalum nitride (TaN) or titanium nitride (TiN), may be deposited, for example, by conventional physical vapor deposition (PVD), chemical vapor deposition (CVD) or atomic layer deposition (ALD) techniques onto the etched surfaces of dielectric 108 and hard mask 110. First liner layer 112 has a thickness ranging approximately from 20 nm to approximately 100 nm and coats the line opening 100 and 200A, via opening 200B and hard mask 110.

First dielectric material 102 of lower interconnect level 40 may include any interlevel or intralevel dielectric including inorganic dielectrics or organic dielectrics that may be porous or non-porous. The typical thickness of first dielectric material 102 may range from approximately 200 nm to approximately 450 nm.

Conductive feature 104 includes a conductive material that may be separated from first dielectric material 102 by a barrier layer (not shown). The barrier layer may be tantalum (Ta), tantalum nitride (TaN), titanium (Ti), titanium nitride (TiN), ruthenium (Ru), ruthenium nitride (RuN), tungsten (W), tungsten nitride (WN) or any other material that can serve as a barrier to prevent conductive material from diffusing there through. The barrier layer may have a thickness from approximately 4 nm to approximately 40 nm, more typically approximately 7 nm to approximately 20 nm. Conductive feature 104 includes, for example, polysilicon, a conductive metal (e.g. Cu, W), an alloy comprising at least one conductive metal (e.g. Al, with Cu or a Cu alloy), a conductive metal silicide or combinations thereof. Conductive feature 104 has an upper surface 105 that is substantially coplanar with an upper surface 103 of the first dielectric material 102 on which dielectric capping layer 106 is disposed.

Dielectric capping layer 106 includes any suitable dielectric capping material like silicon carbide (SiC), tetrasilicon ammonia ($Si_4NH_3$), silicon oxide ($SiO_2$), a carbon doped oxide, a nitrogen and hydrogen doped silicon carbide SiC(N, H) or multiple layers thereof. A thickness of the dielectric capping layer 106 may range, for example, from approximately 15 nm to approximately 55 nm, however a thickness from approximately 25 nm to approximately 45 nm may be used.

Second dielectric material 108, which may be the same as that of first dielectric material 102, is disposed on dielectric capping layer 106. Portions of dielectric capping layer 106 are etched to expose conductive feature 104 in the process of forming line opening 200A to allow electrical contact between lower interconnect level 40 and upper interconnect level 50. It should be understood that initial interconnect structure 30 is not confined to limitations discussed with the aid of illustrations in FIG. 2.

Figure 3:
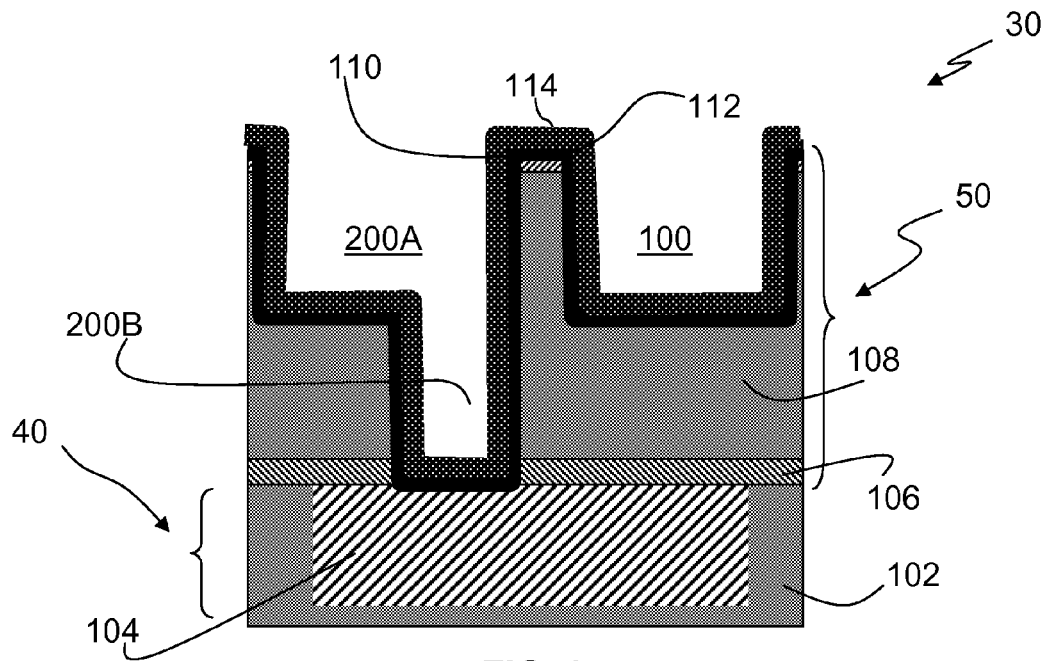
FIG. 3 is a sectional view of a semiconductor with a second liner layer deposited on to the first liner layer illustrated in FIG. 2.

In a second step, shown in FIG. 3, a second liner layer 114 is deposited by, for example, physical vapor deposition (PVD), chemical vapor deposition (CVD) or atomic layer deposition (ALD) techniques onto first liner layer 112. Materials for second liner layer 114 may include a noble metal like ruthenium (Ru), iridium (Ir), platinum (Pt), rhodium (Rh), or alloys of noble metals like ruthenium tantalum (RuTa), iridium tantalum (IrTa), platinum tantalum (PtTa) and rhodium tantalum (RhTa). A thickness of second liner layer 114 may range from approximately 10 nm to approximately 40 nm, while in one embodiment it may range from approximately 15 nm to approximately 20 nm.

Figure 4A:
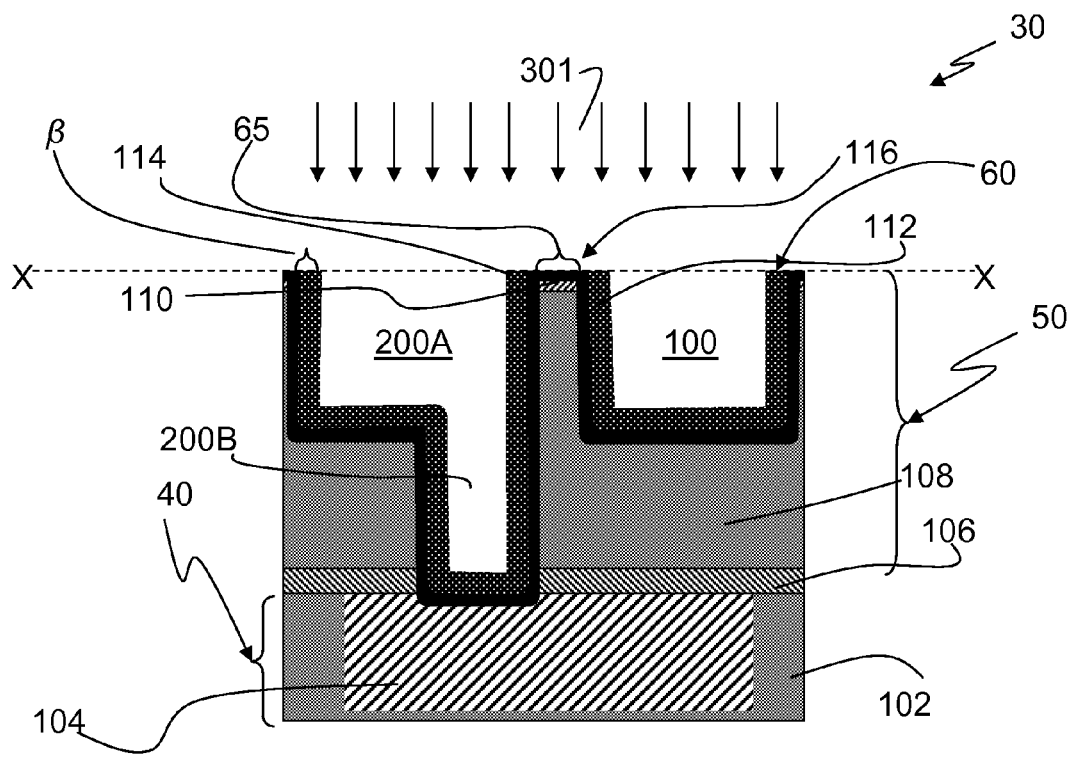
FIG. 4A is a sectional view of a semiconductor where the second liner layer illustrated in FIG. 3 is subjected to a sputter-etching process.
Figure 4B:
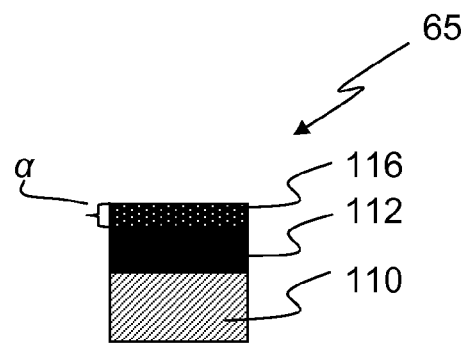
FIG. 4B is a magnified portion of the sectional view of a semiconductor illustrated in FIG. 4A.

In a third step, shown in FIG. 4A, second liner layer 114 may be removed by gaseous sputter etching 301 with a large angular ion flux distribution. In one embodiment, gaseous sputter etching 301 may be conducted under a process pressure of approximately 1.0 millitorr (mT), with a gas flow rate of approximately 35 standard cubic centimeter per minute (sccm), at a temperature of approximately 25° C., where a bias of a top electrode (not shown) is approximately 400 KHz and approximately 600 W and a table bias (not shown) is approximately 13.6 MHz and approximately 200 W. The sputtering technique may use gases like argon (Ar), helium (He), neon (Ne), xenon (Xe), nitrogen ($N_2$), hydrogen ($H_2$), ammonia ($NH_3$) or dinotrogen dihydride ($N_2H_2$). Other techniques may also be employed. After gaseous sputter-etching 301, remaining noble metal material on second liner layer 116, disposed on upper surfaces/fields 60 (denoted by line X-X) of the upper interconnect level 50, has a negligible thickness, α (FIG. 4B). FIG. 4B shows the negligible thickness, α, in magnified portion 65 on the plane denoted by line X-X on upper surfaces of upper interconnect level 50. The thickness, α, is less than the thickness, β, of noble metal liner layer 114 in line openings 100 and 200A and via opening 200B. This is due to the shadowing effect during sputter-etching. Second liner layer 114 on upper surfaces 60 of upper interconnect level 50 may be completely removed, for example, α, may be zero, after sputter etching process 301.

Figure 5:
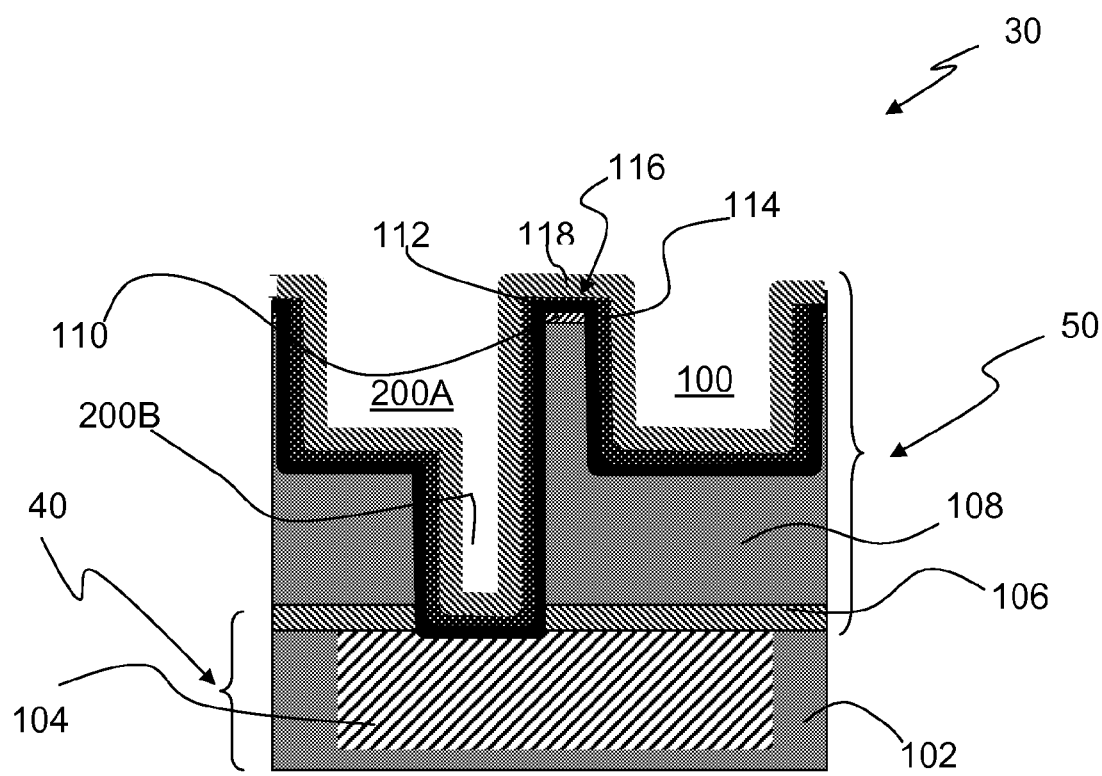
FIG. 5 is a sectional view of a semiconductor with a seed layer deposited on the sputter-etched second liner layer illustrated in FIG. 4A.

According to a next step shown in FIG. 5, a seed layer 118 of conductive wiring material (e.g. copper (Cu), aluminum (Al) or alloy of copper aluminum (CuAl)) may be deposited, for example, by PVD, CVD or ALD techniques. Seed layer 118 provides sufficient field conductivity to enable electroplating of conductive wiring materials. A thickness of seed layer 118 may ranges from approximately 50 Å to approximately 1000 Å. However, a thickness ranging from approximately 200 Å to approximately 800 Å is also possible.

Figure 6:
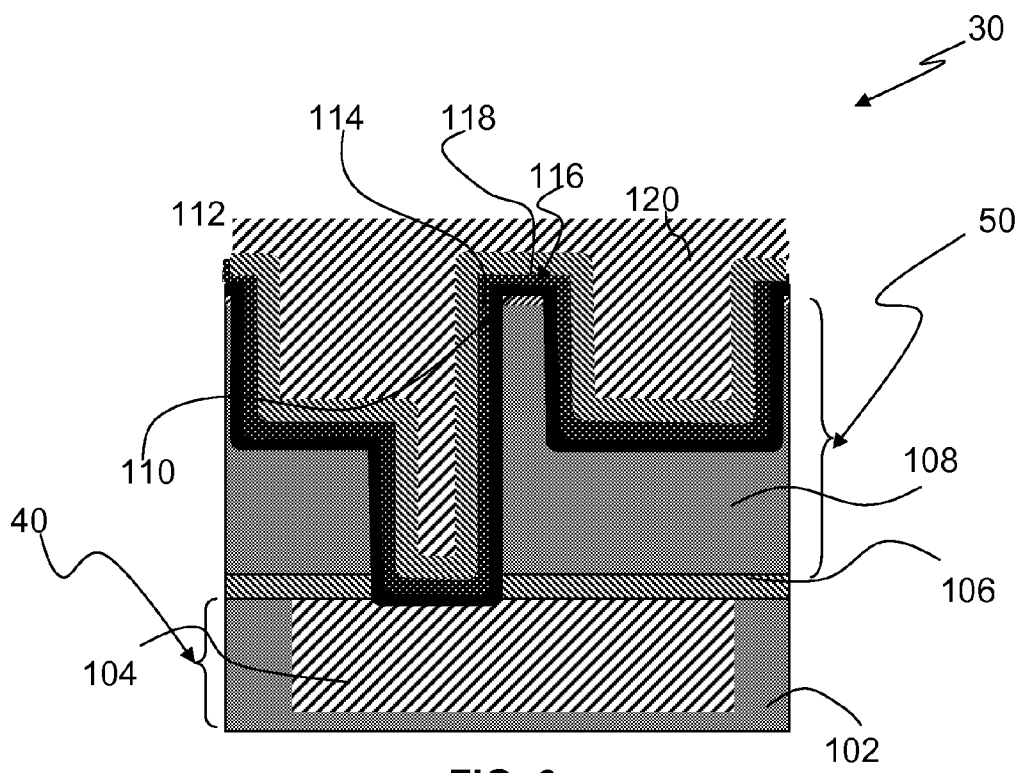
FIG. 6 is a sectional view of a semiconductor with a conductive wiring material plated onto the seed layer illustrated in FIG. 5.

FIG. 6 shows a fifth step where a conductive wiring material 120, like copper (Cu), aluminum (Al) or alloy of copper (Cu) and aluminum (Al), may be deposited on seed layer 118 by electrical plating.

Figure 7:
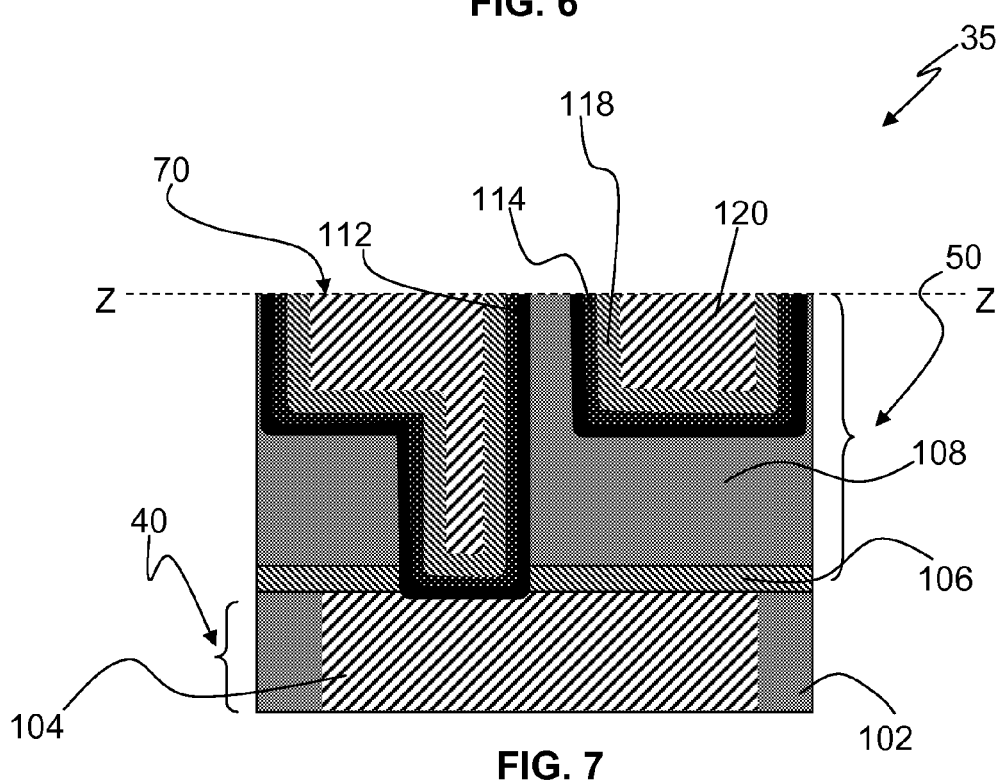
FIG. 7 is a sectional view of a semiconductor in FIG. 6 after chemical-mechanical polishing.

An intermediate interconnect structure 35 shown in FIG. 7 is formed by subjecting the structure in FIG. 6 to chemical-mechanical polishing (CMP) such that conductive wiring material 120 is coplanar with upper surfaces/fields 70 (denoted by line Z-Z in FIG. 7) of upper interconnect level 50 where hard mask 110 is completely removed.

Figure 8:
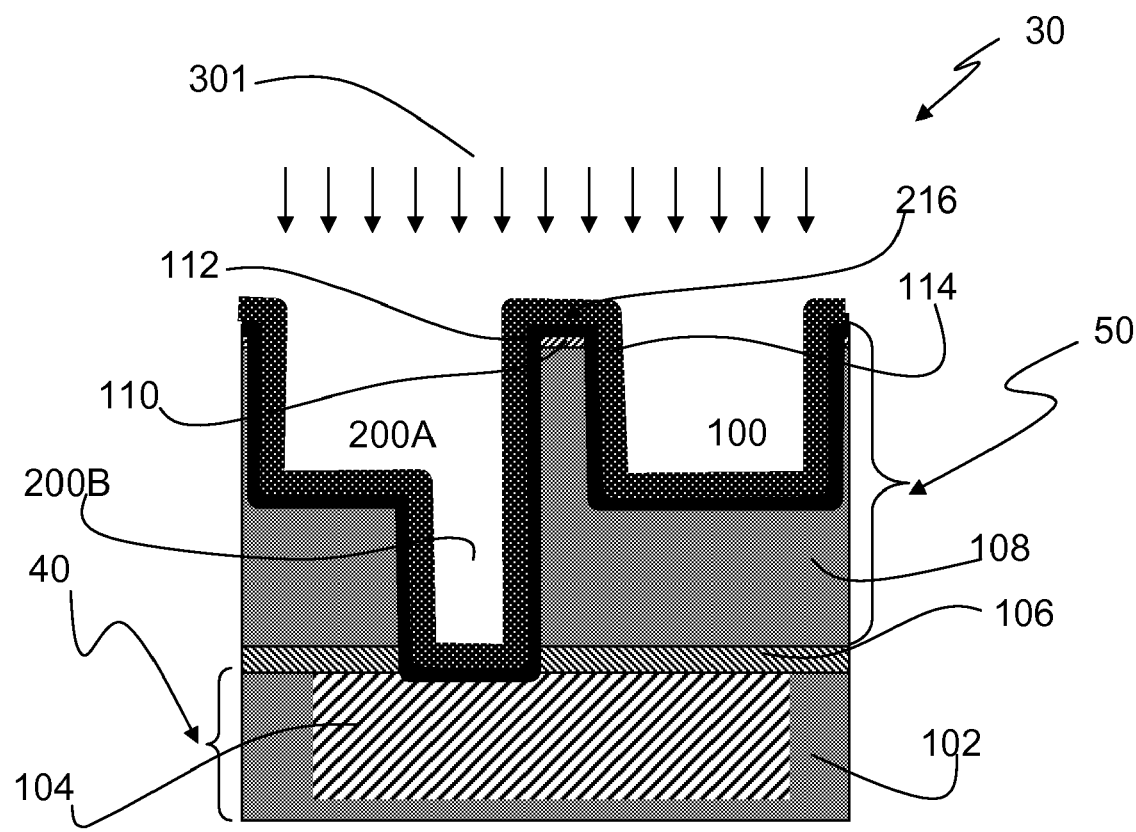
FIG. 8 is a sectional view of a semiconductor in another embodiment of the present invention illustrating a second liner layer that is partially removed by sputter-etching.
Figure 9:
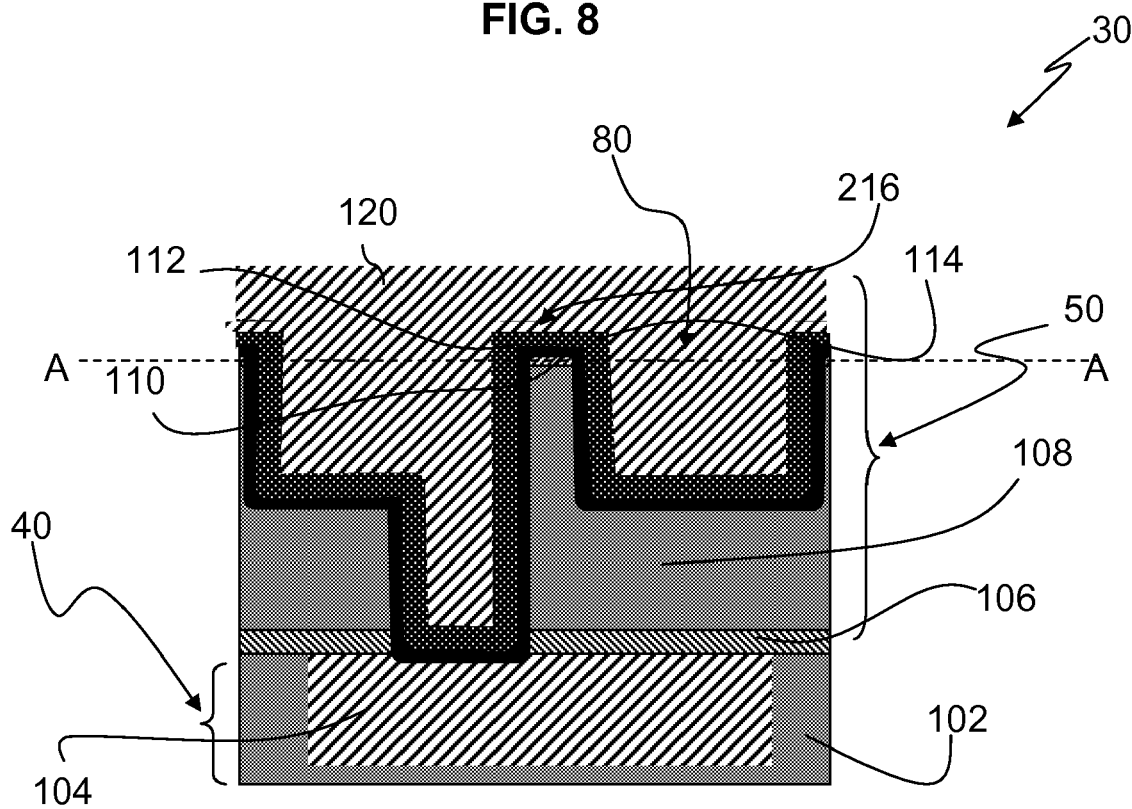
FIG. 9 is a sectional view of a semiconductor with a conductive wiring material plated onto the second liner layer illustrated in FIG. 8.

In an alternative embodiment, shown in FIGS. 8-9, a second liner layer 216 (i.e., the noble metal or noble metal alloy layer) is only partially sputter-etched. This substantially thinned down second liner layer 216 has a thickness ranging from approximately 2 nm to approximately 5 nm. A standard electroplating technique is applied to fill the line openings 100 and 200A and via opening 200B (illustrated in FIG. 8) with conductive wiring material 120 such that the second liner layer 114 line the (shown in FIG. 9) conductive features so formed. CMP is subsequently carried out to polish through hard mask 110 such that all deposited materials are coplanar with surfaces/fields 80 (in the same plan denoted by line A-A, shown in FIG. 9) of the dielectric layer 108 to produce intermediate interconnect structure 35 as illustrated in FIG. 7.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A back end of the line (BEOL) structure of a semiconductor device, the structure comprising:
    a first liner layer disposed on an intermediate interconnect structure, the intermediate interconnect structure having an opening disposed between two surfaces of a dielectric material, wherein the first liner layer is in direct contact with at least a portion of a conductive wiring material of an underneath interconnect layer;
    a noble metal layer disposed on the first liner layer at least in the opening; and
    a conductive wiring material disposed on the noble metal layer, the conductive wiring material substantially filling the opening;
    wherein the first liner layer, the noble metal layer and the conductive wiring material are coplanar with the two surfaces of the dielectric material of the intermediate interconnect structure, and the noble metal layer includes a different material than the first liner layer.

2. The BEOL structure of claim 1, wherein the first liner layer has a thickness ranging from approximately 4 nm to approximately 40 nm.

3. The BEOL structure of claim 1, wherein the first liner layer is formed from a material selected from a group consisting of tantalum (Ta), titanium (Ti), tungsten (W), tantalum nitride (TaN), titanium nitride (TiN), and tungsten nitride (WN).

4. The BEOL structure of claim 1, wherein the noble metal layer is a material selected from a group consisting of ruthenium (Ru), rhodium (Rh), iridium (Ir), platinum (Pt), tantalum ruthenium (TaRu) and alloys thereof.

5. The BEOL structure of claim 1, wherein the noble metal layer has a thickness ranging from approximately 2 nm to approximately 40 nm.

6. The BEOL structure of claim 1, wherein the noble metal layer on the two surfaces has a thickness ranging from approximately 10 nm to approximately 40 nm.

7. The BEOL structure of claim 1, wherein the conductive wiring material is selected from a group consisting of copper (Cu), aluminum (Al) and alloys thereof.

8. A back end of the line (BEOL) structure of a semiconductor device, the structure comprising:
    a first liner layer disposed on an intermediate interconnect structure, the intermediate interconnect structure having an opening disposed between two surfaces of a dielectric material, wherein the first liner layer is in direct contact with at least a portion of a conductive wiring material of an underneath interconnect layer;
    a noble metal layer disposed on the first liner layer at least in the opening; and
    a conductive wiring material disposed on the noble metal layer, the conductive wiring material substantially filling the opening;
    wherein the first liner layer, the noble metal layer and the conductive wiring material are coplanar with the two surfaces of the dielectric material of the intermediate interconnect structure, and the noble metal layer is a material selected from a group consisting of rhodium (Rh), iridium (Ir), platinum (Pt), and alloys thereof.

9. The BEOL structure of claim 8, wherein the first liner layer has a thickness ranging from approximately 4 nm to approximately 40 nm.

10. The BEOL structure of claim 8, wherein the first liner layer is formed from a material selected from a group consisting of tantalum (Ta), titanium (Ti), tungsten (W), tantalum nitride (TaN), titanium nitride (TiN), and tungsten nitride (WN).

11. The BEOL structure of claim 8, wherein the noble metal layer has a thickness ranging from approximately 2 nm to approximately 40 nm.

12. The BEOL structure of claim 8, wherein the noble metal layer on the two surfaces has a thickness ranging from approximately 10 nm to approximately 40 nm.

13. The BEOL structure of claim 8, wherein the conductive wiring material is selected from a group consisting of copper (Cu), aluminum (Al) and alloys thereof.

* * * * *